United States Patent [19]

Yamada

[11] Patent Number: 5,539,319
[45] Date of Patent: Jul. 23, 1996

[54] SURFACE POTENTIAL ELECTROMETER

[75] Inventor: Hiroaki Yamada, Tokyo, Japan

[73] Assignee: NEC Corporation, Tokyo, Japan

[21] Appl. No.: 227,324

[22] Filed: Apr. 14, 1994

[30] Foreign Application Priority Data

Apr. 14, 1993 [JP] Japan ................................. 5-087013

[51] Int. Cl.$^6$ ................................. G01R 29/12
[52] U.S. Cl. ................................. 324/458; 324/109
[58] Field of Search ................................. 324/109, 458, 324/457, 72

[56] References Cited

U.S. PATENT DOCUMENTS

| | | | |
|---|---|---|---|
| 4,367,948 | 1/1983 | Suzuki | 324/458 |
| 4,625,176 | 11/1986 | Champion | 324/458 |
| 5,212,451 | 5/1993 | Werner, Jr. | 324/458 |
| 5,243,292 | 9/1993 | Bouton | 324/458 |

*Primary Examiner*—Ernest F. Karlsen
*Assistant Examiner*—Russell M. Kobert
*Attorney, Agent, or Firm*—Sughrue, Mion, Zinn, Macpeak & Seas

[57] ABSTRACT

An electrometer having small width size and stable characteristics includes a chopper portion for chopping electric line of force emitted from an object to be measured. The chopper portion is constituted with a tuning fork type bending vibrator including a first metal plate as a detection electrode portion for receiving electric line of force, a second metal plate and an insulating plate for connecting the first and second metal plates in a plane. The bending vibrator is arranged such that its vibrating direction is coincident with direction of electric line of force, so that the width size of the electrometer can be reduced and the characteristics thereof can be stabilized.

7 Claims, 3 Drawing Sheets

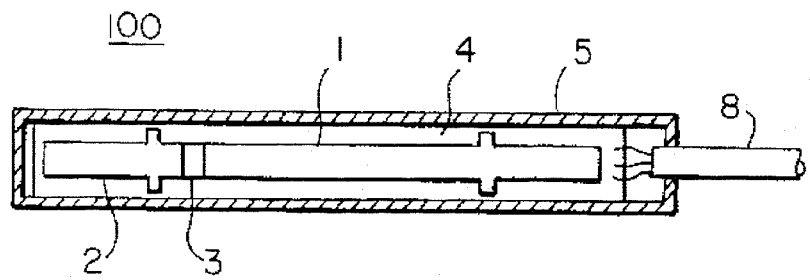
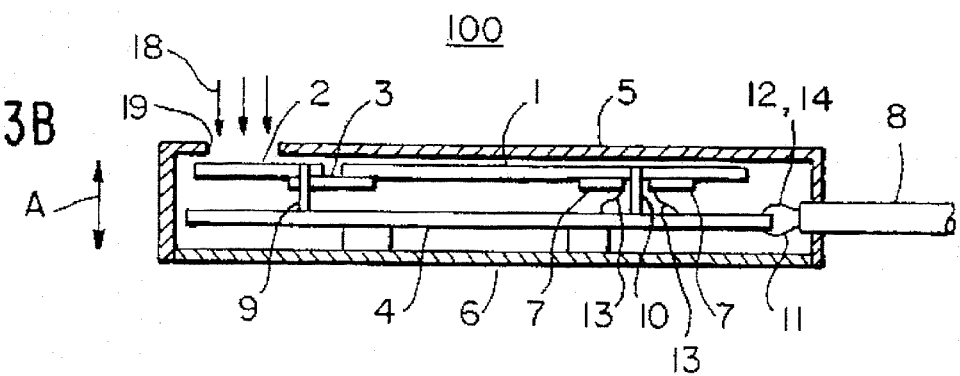
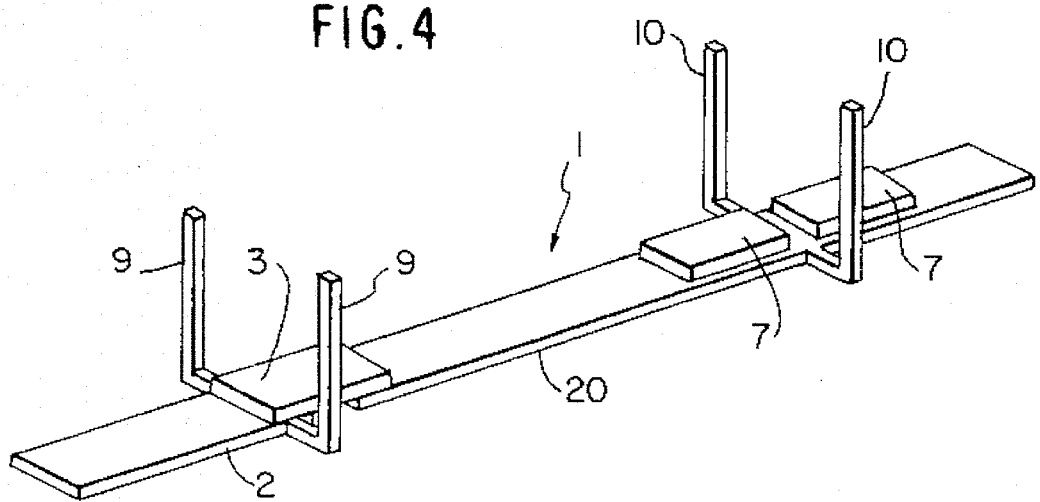
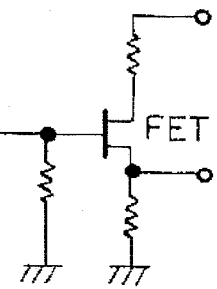

SURFACE POTENTIAL ELECTROMETER

BACKGROUND OF THE INVENTION

The present invention relates to an electrometer for detecting a surface potential of an object to be measured and, particularly, to an electrometer having a function of converting a surface potential into an A.C. signal by means of an electromechanical resonator.

A conventional electrometer includes a casing having a measuring hole for introducing electric line of force emitted from an object to be measured. A tuning fork is provided with a chopper portion for chopping the electric line of force introduced in the casing with a constant period. A detection electrode is responsive to the chopped electric line of force to derive an A.C. signal therefrom. Such electrometer, however, is bulky due to its large width size, for reasons to be described later. Further, an output of such electrometer varies according to a mutual positional relation between the measuring hole, the chopper portion and the detection electrode. In order to solve these problems, an electrometer has been proposed in which an orientation of a tuning fork is changed. In such electrometer having the tuning fork the orientation of which is changed, however, physical characteristics, particularly, stiffness thereof, of an adhesive used to fix a lead wire for leading an output signal thereof onto a surface of an arm of the tuning fork is very sensitive to temperature compared with metal material forming the tuning fork. Therefore, a vibration amplitude of the tuning fork varies considerably with temperature, so that an operation of the electrometer becomes unstable with respect to temperature.

SUMMARY OF THE INVENTION

An object of the present invention is to provide an electrometer which has a small width size and has a characteristic which is stabilized even if the width size thereof is made smaller by changing an orientation of a tuning fork.

An electrometer according to the present invention comprises a casing having a measuring hole for leading in electric line of force emitted from an object to be measured. A tuning fork type bending resonator integrally including a detection electrode receives electric line of force led into the casing. A wiring substrate supports the bending resonator. Since the electrometer according to the present invention has no lead wire for deriving an output from the detection electrode integrally formed on the bending resonator in the form of a flat strip, there is no variation of characteristics thereof and its operation is stable with reduced width size. Further, since the structure of the bending resonator is very simple, it can be manufactured very easily.

BRIEF DESCRIPTION OF THE DRAWINGS

FIGS. 3A and 3B are a cross sectional plan view and a cross sectional front view of a first embodiment of an electrometer according to the present invention, respectively;

FIG. 4 is a perspective view of a tuning fork type bending resonator used in the first embodiment shown in FIGS. 3A and 3B;

FIG. 5 is a circuit diagram of an example of an amplifier circuit for amplifying an output of the electrometer in FIGS. 3A and 3B;

DETAILED DESCRIPTION OF THE PREFERRED EMBODIMENTS

In order to facilitate an understanding of the present invention, conventional electrometers will be described first.

Figure 1A:
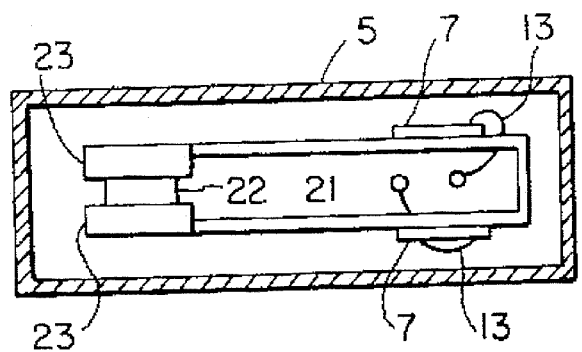
FIGS. 1A and 1B are a cross sectional plan view and a cross sectional front view of a first conventional electrometer, respectively.
Figure 1B:
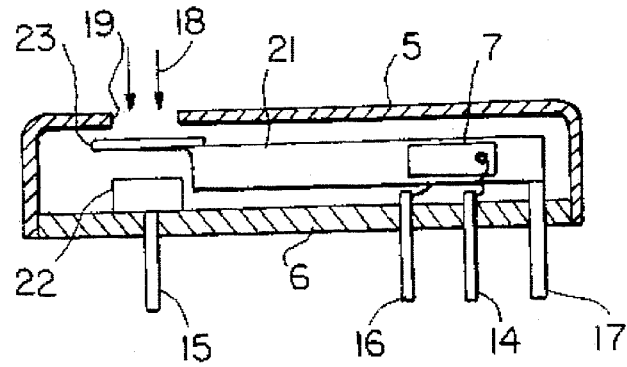

In FIGS. 1A and 1B showing a first conventional electrometer, the electrometer comprises a casing 5 having a measuring hole 19 for taking in electric line of force emitted from an object which is not shown and whose surface potential is to be measured. A tuning fork 21 having chopper portions 23 chops electric line of force 18 taken in the casing 5. A detection electrode 22 is responsive to the chopped electric line of force 18 to derive an A.C. signal. Piezoelectric ceramics 7 are bonded onto outer surfaces of the tuning fork 21. Further, the tuning fork 21 and the detection electrode 22 are fixed on a substrate 6 which is housed in the casing 5 having the measuring hole 19. An input/output terminal 16 and a ground terminal 14 for the piezoelectric ceramics for supplying the driving signal of the tuning fork and for deriving an output signal from the tuning fork are provided in predetermined positions on the substrate 6.

However, a size of the electrometer is relatively large, since a size of the casing 5 in width direction (vertical direction in FIG. 1A) must be large enough to receive two chopper portions 23 which are spaced by a certain gap and are provided on outer surfaces thereof with the piezoelectric ceramics 7 with a margin large enough to allow lead wirings 13 for the piezoelectric ceramics 7.

Figure 2A:
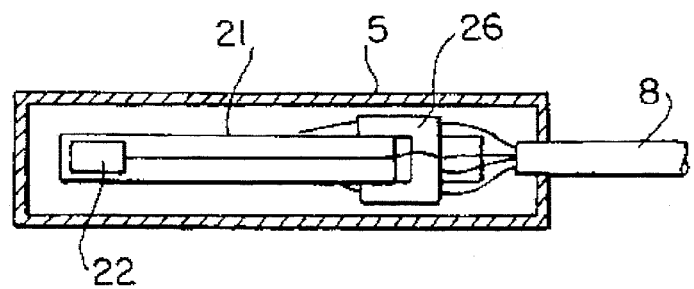
FIGS. 2A and 2B are a cross sectional plan view and a cross sectional front view of a second conventional electrometer, respectively.
Figure 2B:
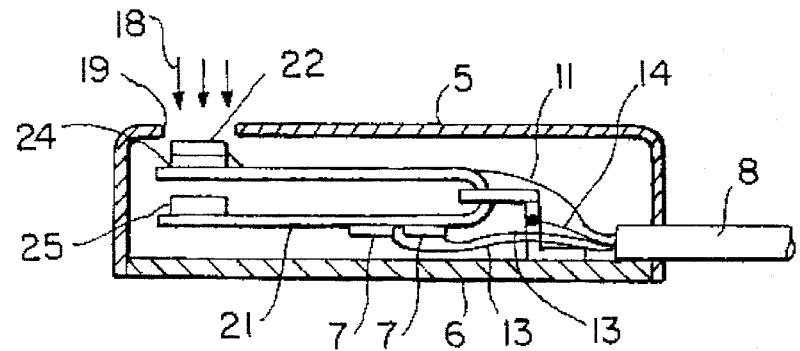

In FIGS. 2A and 2B, a second example of the conventional electrometer includes a casing 5 having a measuring hole 19 for taking in electric line of force emitted from an object which is not shown and whose surface potential is to be measured. A detection electrode 22 is mounted on a top end portion of an arm of a tuning fork 21 through an insulating plate 24 and receives electric line of force 18 led in the casing 5 while being vibrated with a constant period with respect to an object to be measured. Piezoelectric ceramics 7 are bonded onto the tuning fork 21 by adhesive. The tuning fork 21 is fixed on a substrate 6 which is housed in the casing 5 having the measuring hole 19. A lead wire 11 for deriving the output signal from the detection electrode 22 is fixed by adhesive on a surface of an arm of the tuning fork so that influence of it to vibration of the tuning fork 21 is minimized. Width of the electrometer of the second example can be smaller than that of the first example since it is restricted by only a width of a support portion 26 of the tuning fork. However, as mentioned previously, the vibrating amplitude of the tuning fork depends largely on temperature and the operation of the electrometer becomes unstable.

FIGS. 3A and 3B are a cross sectional plan view and a cross sectional front view of a first embodiment of an electrometer according to the present invention, respectively. In these figures, the electrometer 100 includes a tuning fork type bending vibrator 1 formed by connecting a first metal plate as a detection electrode 2 to a second metal plate 20 (FIG. 4) through an insulating plate 3. The bending vibrator 1 is supported by a wiring substrate 4 through support portions 9 and 10. A base 6 supports the wiring substrate 4 and a casing which houses all of the above-mentioned elements has a measuring hole 19.

The bending vibrator 1 is constituted with the first metal plate as the detection electrode 2, the insulating plate 3 and the second metal plate 20 shown in a right portion in FIG. 4. The detection electrode 2 and the insulating plate 3 are connected by adhesive and the insulating plate 3 and the second metal plate 20 are also connected by adhesive. Piezoelectric ceramics 7 for driving the bending vibrator and for deriving a vibration signal are bonded to the bending vibrator by adhesive. The support portions 9 and 10 are provided such that they support the bending vibrator 1 at its nodal point, respectively. The support portions 9 and 10 are integrally formed with the first metal plate 2 and the second metal plate 20 and connected to the wiring substrate 4 by such as solder, respectively.

FIG. 4 is a perspective view of the bending vibrator 1 used in this embodiment. An operation of this embodiment will be described with FIGS. 3A, 3B and 4. Electric line of force 18 emitted from an object to be measured passes through the measuring hole 19 to the detection electrode 2 and induces an electrostatic potential in the detection electrode 2.

Since the piezoelectric ceramics 7 of the bending vibrator 1 are connected to an external drive circuit through the lead wire 13 and wirings on the wiring substrate, the bending vibrator 1 is subjected to bending vibration. Since the detection electrode 2 vibrates vertically as shown by an arrow A in FIG. 3B due to vibration of the bending vibrator 1, potential induced in the detection electrode 2 varies periodically as in the conventional construction shown in FIGS. 2A and 2B. Therefore, an A.C. voltage having frequency and amplitude corresponding to vibration frequency of the bending vibrator and amplitude of vibration is generated between the detection electrode and ground. The amplitude of this A.C. voltage is small. In order to convert the voltage into a signal which is easily processed, it is amplified by an amplifier having a high input impedance.

Figure 6:
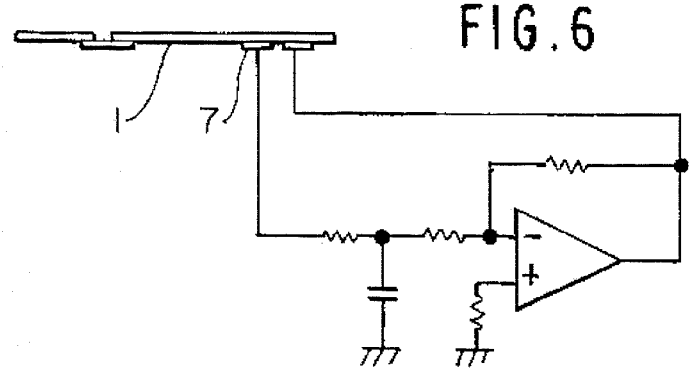
FIG. 6 is a circuit diagram of an example of a drive circuit for driving the bending resonator.

FIGS. 5 and 6 show examples of such amplifier. A circuit of this amplifier may be formed on the wiring substrate 4 shown in FIGS. 1A and 1B. The description of the circuits shown in FIGS. 5 and 6 are omitted since these are well known in the art.

The bending vibrator 1 is fixed on the wiring substrate 4 by the support portions 9 and 10 which also act electrically as wirings for the detection electrode portion 2 as well as a wiring on the wiring substrate 4 and as grounding wiring for the bending vibrator, respectively. Therefore, there is no need of providing lead wirings therefor. Further, since variation of output signal of this electrometer is restricted only by a positional relation between the measuring hole and the detection electrode, the size can be made smaller than the conventional electrometer using choppers.

Figure 7A:
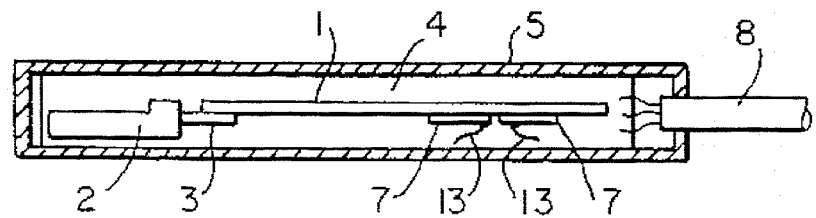
FIGS. 7A and 7B are a cross sectional plan view and a cross sectional front view of a second embodiment of an electrometer according to the present invention, respectively.
Figure 7B:
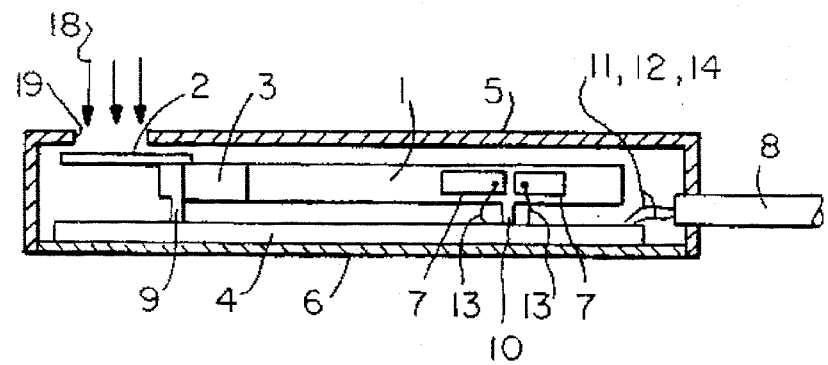

FIGS. 7A and 7B are a cross sectional plan view and a cross sectional front view of a second embodiment of an electrometer according to the present invention, respectively. The electrometer shown in FIGS. 7A and 7B differs from the first embodiment shown in FIGS. 3A and 3B in that a detection electrode 2 is formed by a metal plate bent at right angle.

Figure 8:
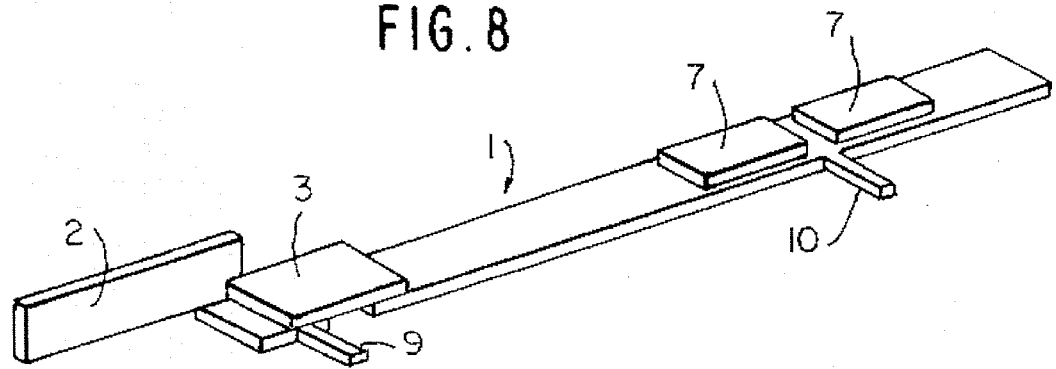
FIG. 8 is a perspective view of a cantilever resonator used in the second embodiment shown in FIGS. 7A an 7B.

FIG. 8 is a perspective view of a bending vibrator used in the electrometer shown in FIGS. 7A and 7B. In the electrometer according to this embodiment, vibrating direction of the detection electrode portion 21 is perpendicular to electric line of force. Therefore, electric line of force received by the detection electrode through the measuring hole varies with vibration thereof, resulting in an A.C. signal. Since the basic construction of the electrometer shown in FIGS. 7A and 7B is the same as that shown in FIGS. 1A and 1B, its output is stable with smaller width size.

What is claimed is:

1. An electrometer comprising:

a bending vibrator having a detection electrode for receiving electric line of force from an object to be measured;

a casing for installing said bending vibrator; and supporting means for supporting said bending vibrator at least at two nodal points thereof.

2. The electrometer claimed in claim 1, wherein said bending vibrator comprises a first metal plate as said detection electrode, a second metal plate, an insulating plate for connecting said first metal plate and said second metal plate in a plane, and at least two piezoelectric ceramics bonded onto said second metal plate.

3. The electrometer claimed in claim 6, wherein said first metal plate as said detection electrode is constituted with a metal plate bent at right angle.

4. The electrometer claimed in claim 2, wherein said supporting means includes a first supporting member and a second supporting member.

5. The electrometer claimed in claim 4, wherein said first supporting member and said second supporting member are integrally formed with said first metal plate and said second metal plate, respectively.

6. The electrometer claimed in claim 5, wherein each of said first metal plate and said second metal plate is connected to a wiring substrate through said first supporting member and said second supporting member, respectively.

7. The electrometer claimed in claim 1, wherein said supporting means is used as a lead for output signal of said electrometer.

* * * * *